United States Patent
Roehr et al.

(10) Patent No.: US 6,950,328 B2
(45) Date of Patent: Sep. 27, 2005

(54) IMPRINT SUPPRESSION CIRCUIT SCHEME

(75) Inventors: Thomas Roehr, Munich (DE); Michael Jacob, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/734,439

(22) Filed: Dec. 11, 2003

(65) Prior Publication Data

US 2005/0128779 A1    Jun. 16, 2005

(51) Int. Cl.$^7$ ............................................. G11C 11/22

(52) U.S. Cl. ........................................ 365/145; 365/196

(58) Field of Search ................................. 365/145, 196, 365/235, 238.5, 189.04

(56) References Cited

U.S. PATENT DOCUMENTS

| | | | | |
|---|---|---|---|---|
| 5,707,861 A | * | 1/1998 | Sherman et al. | 435/306.1 |
| 5,991,197 A | * | 11/1999 | Ogura et al. | 365/185.11 |

* cited by examiner

*Primary Examiner*—Thong Q. Le
(74) *Attorney, Agent, or Firm*—Fish & Richardson P.C.

(57) ABSTRACT

A ferroelectric memory array includes a plurality of memory pages each formed of a plurality of ferroelectric memory cells. The ferroelectric memory cells are supplied by common word lines. Status memory cells are connected to each of the plurality of memory pages, each status memory cell stores the status of the memory page to which it is connected. A plurality of sense amplifiers each receives inputs from a pair of bit lines. Each of the bit lines receives inputs from the ferroelectric memory cells of a plurality of the memory pages. The sense amplifiers write back data into the memory cells and status cells in reversed states following read operations.

4 Claims, 3 Drawing Sheets

IMPRINT SUPPRESSION CIRCUIT SCHEME

FIELD OF THE INVENTION

The present invention relates to imprint suppression in ferroelectric capacitors.

BACKGROUND OF THE INVENTION

A ferroelectric random access memory (FeRAM) uses a ferroelectric capacitor to store memory cell data. Each memory cell stores a logic state based on electric polarization of the ferroelectric capacitor. The ferroelectric capacitor has a dielectric including a ferroelectric such as PZT (lead zirconate titanate) between two electrodes. When a voltage is applied to each plate of the ferroelectric capacitor, the ferroelectric is polarized in a field direction. A voltage above the coercive voltage changes the polarization state of the ferroelectric capacitor. The ferroelectric capacitor operates with hysteresis, and current flows to the capacitor in accordance with the polarization state. If the applied voltage is greater than the coercive voltage, the ferroelectric capacitor will change the polarization state in accordance with a polarity of the applied voltage. The polarization state can be maintained after removing the power source, resulting in non-volatility. The ferroelectric capacitor changes between the polarization states within a short time, e.g., about 1 ns. The programming time of the ferroelectric memory device is faster than that of most other non-volatile memory devices such as erasable programmable read only memories (EPROMs), electrically erasable programmable read only memories (EEPROMs), and flash EEPROMs.

The performance of an FeRAM degrades due to aging of the ferroelectric capacitor. One major aging mechanism in such ferroelectric capacitors is imprint. Imprint is the enhancement of one stored polarization state and the weakening of the reversed state. In the worst case, due to aging, an imprinted ferroelectric capacitor cannot be reversed, causing the memory cell to fail. Two types of imprint causing the aging effect are static imprint, which is caused by the storage of certain data over an extended period of time, and dynamic imprint, which is caused by the continuous reading and writing back of the same data. It would be desirable to provide a circuit scheme for reducing the effect of both of these imprint aging mechanisms.

SUMMARY OF THE INVENTION

The present invention provides a circuit scheme for reducing the effect of both the static and dynamic imprint aging mechanisms. The physical data in a memory cell, and thus the polarization state of the ferroelectric capacitor, is reversed each time the cell is read, thus reducing the imprint effect drastically in typical applications and significantly increasing the reliability of the memory cells.

A ferroelectric memory array includes a plurality of memory pages each formed of a plurality of ferroelectric memory cells. The ferroelectric memory cells are supplied by common word lines. Status memory cells are connected to each of the plurality of memory pages, each status memory cell stores the status of the memory page to which it is connected. A plurality of sense amplifiers each receives inputs from a pair of bit lines. Each of the bit lines receives inputs from the ferroelectric memory cells of a plurality of the memory pages. The sense amplifiers write back data into the memory cells and status cells in reversed states following read operations.

BRIEF DESCRIPTION OF THE FIGURES

Further preferred features of the invention will now be described for the sake of example only with reference to the following figures, in which.

DETAILED DESCRIPTION OF THE EMBODIMENTS

The present invention reduces the effect of both the static and dynamic imprint aging mechanisms by frequently reversing the stored data and thus frequently reversing the internal polarization of the ferroelectric material.

Figure 1:
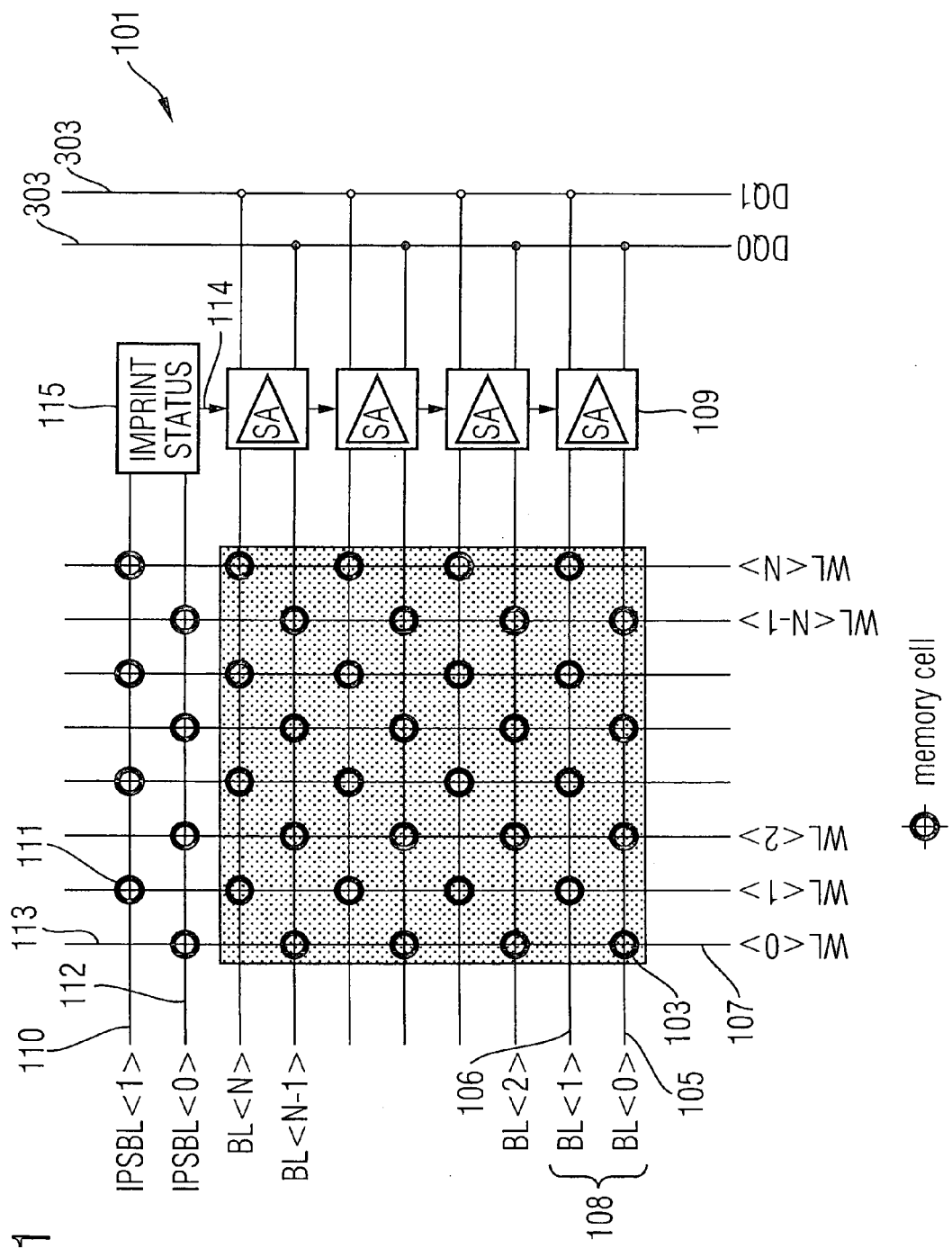
FIG. 1 shows a part of a ferroelectric memory (FeRAM) array comprising a plurality of ferroelectric memory cells at cross points of word lines and bit lines.

FIG. 1 shows a part of a ferroelectric memory (FeRAM) array 101 comprising a plurality of ferroelectric memory cells 103 at cross points of word lines (WL) 107 and bit lines (BL) 105. The bit lines 105 are connected as pairs, for example a pair 108 consisting of the bit line 105 and a bit line 106, to differential sense amplifiers 109. For reading and writing a plate line is used (not shown). FeRAM architectures other than the particular one shown in FIG. 1 can also be used with the present invention.

Figure 3:
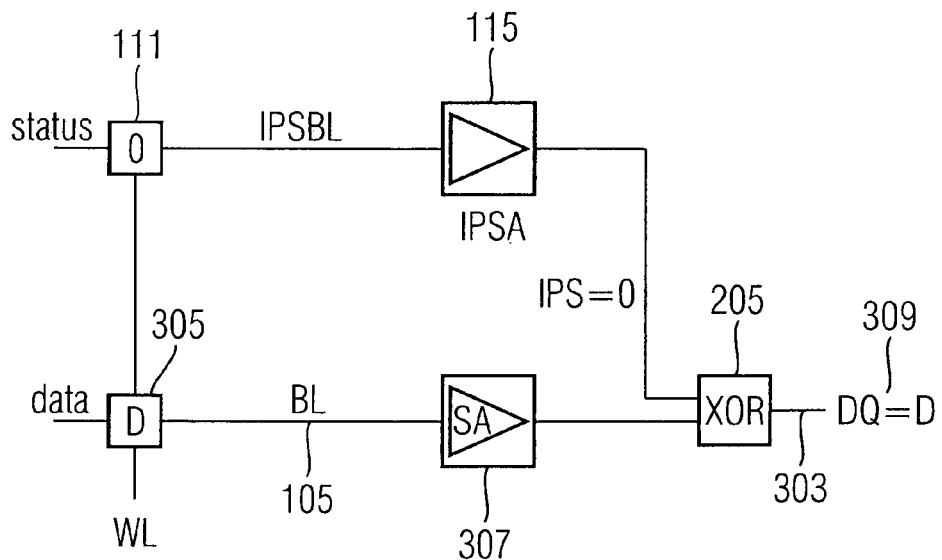
FIGS. 3 and 4 show the regeneration of logical data from the physically stored data.

In the array 101 of FIG. 1, the plurality of cells 103 are connected to each word line 107. Each of these plurality of cells 103 forms a "memory page" 113 and is used to store the data. According to the present invention, an additional memory page status cell 111 is connected to each of the pages and is used to store the status of the page to which it is connected. The status of each memory page 113 stored by each of the memory page status cells 111 can be "true" (D) or complement (/D). The page status cells 111 are connected together forming a pair of IPSBLs (imprint status bit lines) 110, 112. The pair of IPSBL's 110, 112 provides outputs to an imprint status circuit 115. The imprint status circuit 115 is comprised of imprint sense amplifiers (IPSA), as illustrated in FIG. 3, and provides a control signal 114 to the differential sense amplifiers 109.

Memory cells 103 forming the same bit line (e.g. the bit line 105) are part of memory pages (e.g. the memory page 113) having page status cells (e.g. the page status cell 111) forming a common IPSBL (e.g the IPSBL 112). Thus, memory cells 103 of the bitline 105 supplying outputs to one of the differential inputs of the sense amplifier 109 will belong to memory pages having memory page status cells supplying outputs to a common imprint status circuit 115 input.

Figure 2:
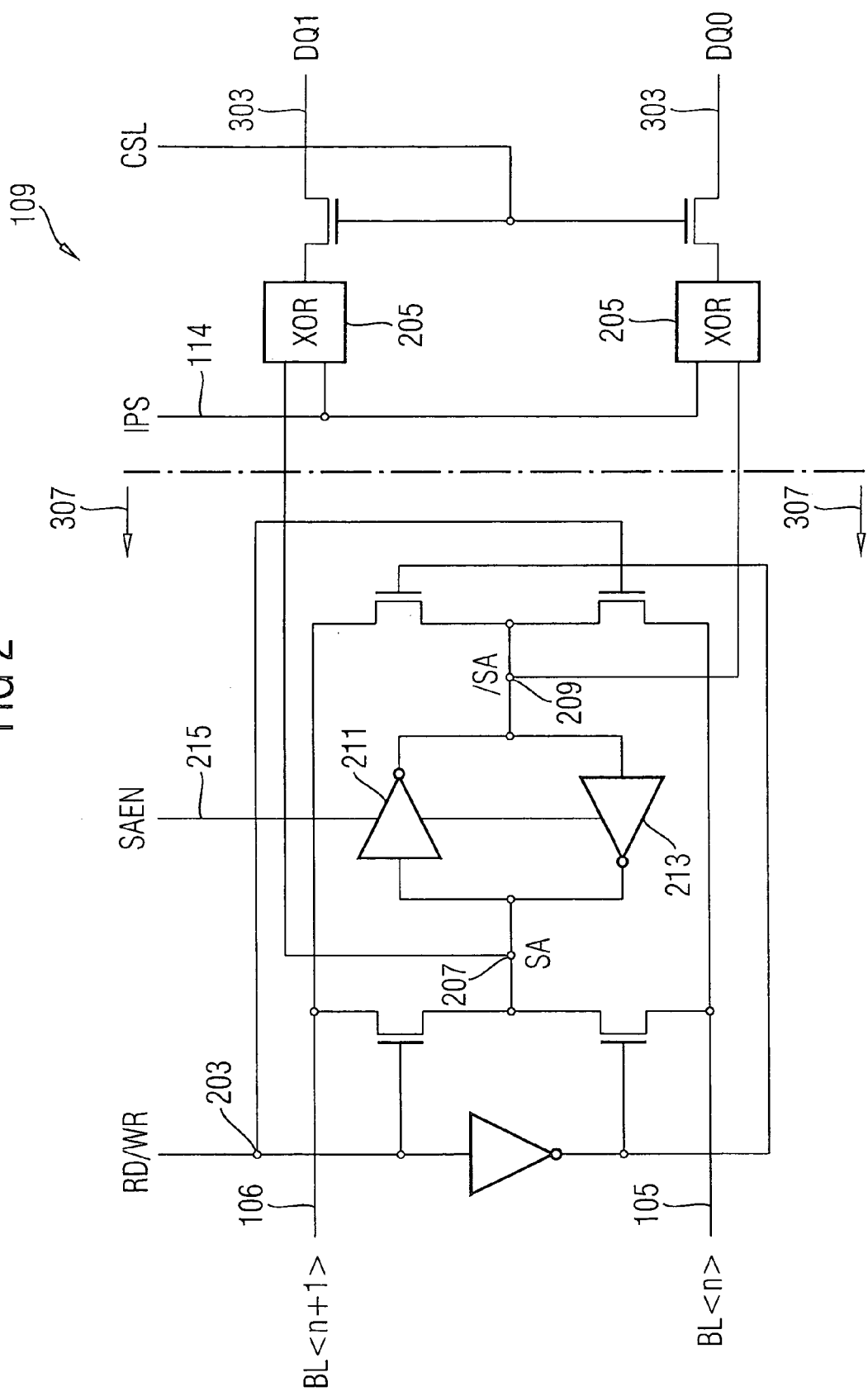
FIG. 2 shows a sense amplifier circuit of the present invention.

After each read operation of the memory pages 113, the data is written back both into the memory cells 103 and the memory page status cells 111 in the data's reversed state. This reversed write-back is done by the inventive sense amplifier circuit 109 of FIG. 1 which is shown in more detail in FIG. 2. FIG. 2 includes two inverters 211, 213 activated by a sense amplifier enable signal (SAEN) 215. Other similar amplifier circuits can also be used.

During a read operation a signal RD/WR 203 is at high potential. This results in the bit line BL<n+1>106 being connected to a node of the sense amplifier (node SA) 207. It also results in the bit line BL<n>105 being connected to a node of the sense amplifier (node /SA) 209. Thus, the bit lines 105, 106 are directly connected to the sense amplifier 109.

During write back, the signal RD/WR 203 is at low potential. This results in the bit line BL<n+1>106 being connected to the node /SA 209. It also results in the bit line BL<n>105 being connected to the node SA 207. Thus, the bit line pair 108 is intersected. This scheme reverses the physical data in the storage cells 103 during each read access.

Although the physical data is reversed, the logical data which is read from the entire memory array 101 must stay the same. This is accomplished by inserting XOR gates 205 in the data path.

Figure 4:
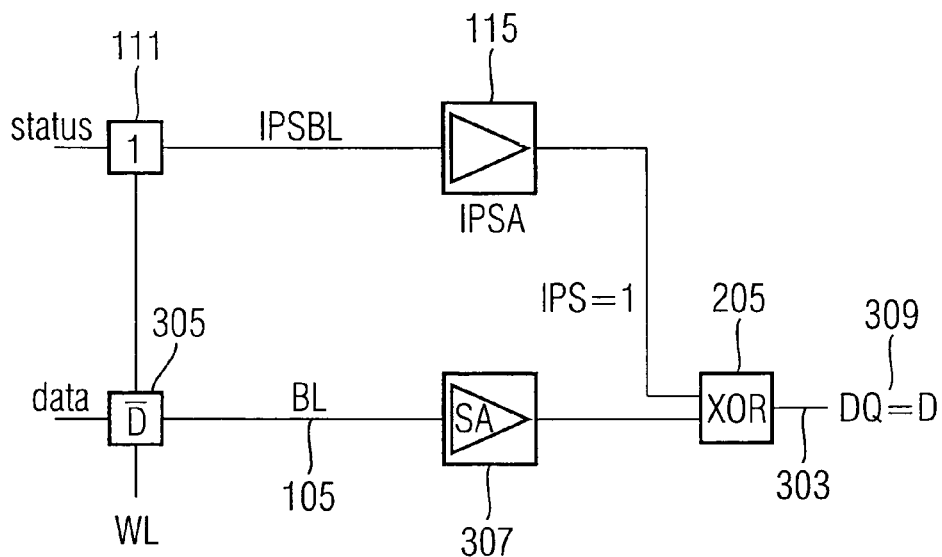

FIGS. 3 and 4 show the regeneration of the logical data 309 from the physically stored data 305 stored in the memory cells 103. The sense amplifier SA 307 represents the portion of the differential sense amplifier 109 to the left of the dashed line. If the physical data is true data (D), as in FIG. 3, the memory page status cells 111 store logical "0" and the read data passes the XOR gate 205 directly. If the physical data is complement data (/D), as in FIG. 4, the memory page status cells 111 stores a logical "1" and the read data is reversed by the XOR gate 205.

In both cases the data on the main data bus (DQ) 303 reflects the original logical data (D) 305 which was stored in the memory cell 103.

In a write operation, the data 305 is written directly into the memory cell 103 (true data, D) and the status cell 111 is set to "0", reflecting this status.

Although the invention has been described above using particular embodiments, many variations are possible within the scope of the claims, as will be clear to a skilled reader.

We claim:

1. A ferroelectric memory array comprising:
   a plurality of memory pages each formed of a plurality of ferroelectric memory cells supplied by common word lines;
   status memory cells connected to each of the plurality of memory pages, each status memory cell storing the status of the memory page to which it is connected; and
   a plurality of sense amplifiers each receiving inputs from a pair of bit lines, each bit line of the pair receiving inputs from ferroelectric memory cells from a plurality of the memory pages, the sense amplifiers writing back data into the memory cells and status cells in reversed states following read operations.

2. The ferroelectric memory array of claim 1, wherein during read operations pairs of bit lines are directly connected to the sense amplifier and during write back pairs of bit lines are intersected.

3. A ferroelectric memory array comprising:
   a plurality of memory pages each formed of a plurality of ferroelectric memory cells supplied by common word lines;
   status memory cells connected to each of the plurality of memory pages, each status memory cell storing the status of the memory page to which it is connected;
   a plurality of sense amplifiers each receiving inputs from a pair of bit lines, each bit line of the pair receiving inputs from ferroelectric memory cells from a plurality of the memory pages, the sense amplifiers writing back data into the memory cells and status cells in reversed states following read operations; and
   a pair of imprint status bit lines connecting status memory cells together to provide input to an imprint status amplifier, the imprint status amplifier providing outputs to XOR gates of the sense amplifiers to provide logical data from the memory array which does not change when the physical data is reversed.

4. A ferroelectric memory array comprising:
   a plurality of memory pages each formed of a plurality of ferroelectric memory cells supplied by common word lines;
   status memory cells connected to each of the plurality of memory pages, each status memory cell storing the status of the memory page to which it is connected;
   a plurality of sense amplifiers each receiving inputs from a pair of bit lines, each bit line of the pair receiving inputs from ferroelectric memory cells from a plurality of the memory pages, the sense amplifiers writing back data into the memory cells and status cells in reversed states following read operations; and
   wherein the sense amplifier is comprised of a pair of inverters.

* * * * *